(12) United States Patent
Derner

(10) Patent No.: US 6,515,915 B2
(45) Date of Patent: Feb. 4, 2003

(54) CIRCUITS AND METHODS FOR OUTPUTTING MULTI-LEVEL DATA THROUGH A SINGLE INPUT/OUTPUT PIN

(75) Inventor: Scott J. Derner, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/047,476

(22) Filed: Oct. 23, 2001

(65) Prior Publication Data

US 2002/0080671 A1 Jun. 27, 2002

Related U.S. Application Data

(62) Division of application No. 09/256,871, filed on Feb. 24, 1999, now Pat. No. 6,307,800, which is a continuation of application No. 09/027,978, filed on Feb. 23, 1998, now Pat. No. 5,896,337.

(51) Int. Cl.$^7$ ................................................. G11C 7/16
(52) U.S. Cl. .............................. 365/189.05; 365/189.11; 365/189.09; 365/189.08; 365/190; 365/168; 365/220; 365/230.06; 365/51
(58) Field of Search ................................ 365/168, 220, 365/189.05, 189.08, 189.09, 189.11, 190, 51, 63, 230.06

(56) References Cited

U.S. PATENT DOCUMENTS

| | | | |
|---|---|---|---|
| 3,935,476 A | 1/1976 | Paluck ........................ 326/62 |
| 4,434,474 A | 2/1984 | Best et al. .................... 710/71 |
| 4,604,692 A | 8/1986 | Muramaki ..................... 713/1 |
| 4,774,422 A | * 9/1988 | Donaldson et al. ........... 326/86 |
| 5,228,000 A | 7/1993 | Yamagata .................... 365/201 |
| 5,302,870 A | 4/1994 | Chern ......................... 327/51 |
| 5,339,079 A | 8/1994 | Ledzius et al. ............. 341/144 |
| 5,367,655 A | 11/1994 | Grossman et al. ..... 365/230.03 |
| 5,371,869 A | 12/1994 | Lee ............................. 713/600 |
| 5,394,362 A | 2/1995 | Banks ................... 365/185.03 |
| 5,457,650 A | 10/1995 | Sigiura et al. ............... 365/184 |
| 5,500,825 A | 3/1996 | Onaya et al. ................ 365/219 |
| 5,675,336 A | 10/1997 | Hakkarainen ................ 341/135 |
| 5,689,462 A | * 11/1997 | Proebsting ............. 365/189.05 |
| 5,777,488 A | * 7/1998 | Dryer et al. ................... 326/38 |
| 5,896,337 A | 4/1999 | Derner ........................ 365/220 |

FOREIGN PATENT DOCUMENTS

| | | | |
|---|---|---|---|
| DE | 4135220 | 4/1993 | ............ G06F/3/06 |
| DE | 4135220 C1 | 4/1993 | ............ G06F/3/06 |
| GB | 2253078 A | 8/1992 | ............ G06F/3/16 |
| GB | 2253078 | 8/1992 | ............ G06F/3/16 |
| JP | 03-062246 | 3/1991 | ............ G06F/12/16 |
| JP | 10-223000 | 8/1998 | ............ G11C/29/00 |
| JP | 11-085403 | 3/1999 | ............ G06F/3/05 |

OTHER PUBLICATIONS

Chioffi et al., "High–speed, low–switching noise CMOS memory data output buffer", IEEE Journal of Solid–State Circuits, vol. 29, Issue 11, Nov. 1994, pp. 1359–1365.*

Ikeda et al., "A stacked split word–line (SSW) cell for low–voltage operation, large capacity, high speed SRAMs", International Technical Digest, Electron Devices Meeting, 1993, pp. 809–812.*

* cited by examiner

Primary Examiner—Andrew Q. Tran
(74) Attorney, Agent, or Firm—Schwegman, Lundberg, Woessner & Kluth, P.A.

(57) ABSTRACT

A method and memory circuits for increasing the data bandwidth per microprocessor operation cycle is provided. The memory circuits provide the additional bandwidth without additional input/output (I/O) pins or requiring decreased cycle times. Multiple bits of data are passed through a single input/output pin with each operation cycle. The multiple bits of data are stored in or retrieved from multiple memory cells in each cycle. The I/O pins carry analog signals which represent multiple values of binary data. This method of compressing data can be applied to any device that would benefit from the ability to transfer more data through a limited number of I/O pins.

30 Claims, 6 Drawing Sheets

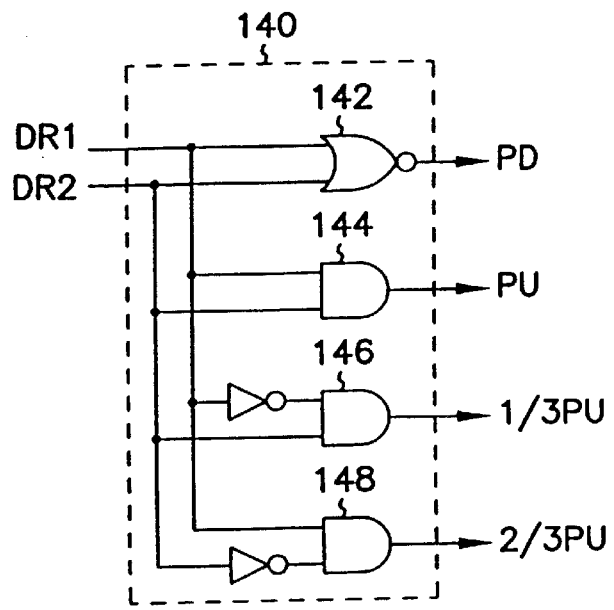
FIG. 4A
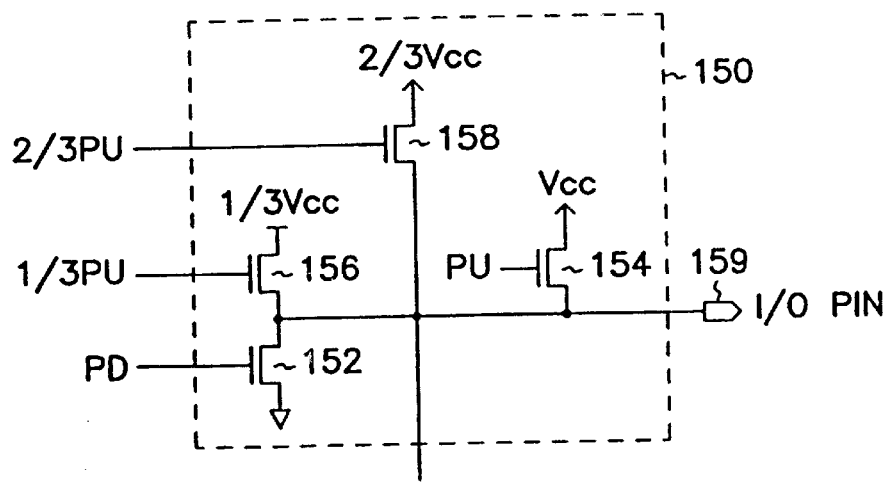
FIG. 4B
| DR1 | DR2 | PD | 1/3PU | 2/3PU | PU |
|-----|-----|----|----|----|----|
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |
FIG. 4C

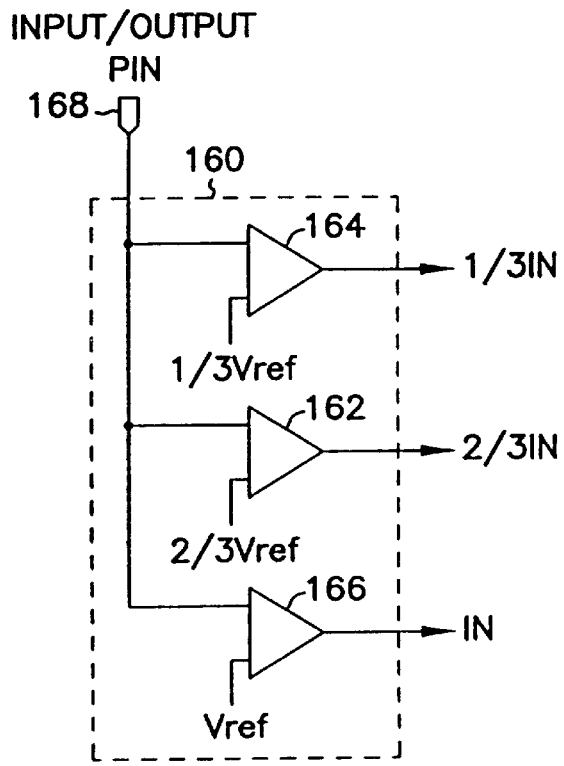
FIG. 5A
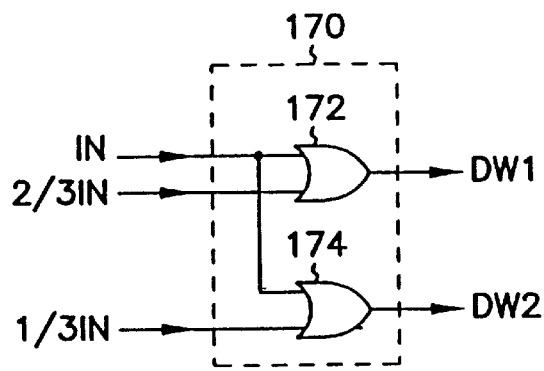
FIG. 5B
| IN | 2/3IN | 1/3IN | DW1 | DW2 |
|----|-------|-------|-----|-----|
| 0  | 0     | 0     | 0   | 0   |
| 0  | 0     | 1     | 0   | 1   |
| 0  | 1     | 0     | 1   | 0   |
| 1  | 0     | 0     | 1   | 1   |
FIG. 5C

CIRCUITS AND METHODS FOR OUTPUTTING MULTI-LEVEL DATA THROUGH A SINGLE INPUT/OUTPUT PIN

This application is a Divisional of U.S. patent application Ser. No. 09/256,871, filed Feb. 24, 1999, now U.S. Pat. No. 6,307,800, which is a Continuation of U.S. application Ser. No. 09/027,978, filed Feb. 23, 1998, now U.S. Pat. No. 5,896,337, both of which are incorporated herewith.

FIELD OF THE INVENTION

The present invention relates generally to semiconductor integrated circuits. More particularly, it pertains to the retrieval and storage of multi-level data through a single input/output pin.

BACKGROUND OF THE INVENTION

Modern electronic systems typically include a data storage device such as a dynamic random access memory (DRAM), static random access memory (SRAM) or other conventional memory device. The memory device stores data in vast arrays of memory cells. Each cell conventionally stores a single bit of data (a logical "1" or a logical "0") and can be individually accessed or addressed. Data is output from a memory cell during a "read" operation, and data is stored into a memory cell during a "write" operation.

In a standard read or write operation, a column decoder and a row decoder translate address signals into a single intersection of a row (wordline) and column (bitline) within the memory array. This function permits the memory cell at that location to be read from or for data to be placed into that cell. The processing of data is dependent on the time it takes to store or retrieve individual bits of data in the memory cells. Storing and retrieving the bits of data is controlled generally by a microprocessor, whereby data,is passed to and from the memory array through a fixed number of input/output (I/O) lines and I/O pins. According to current digital circuit technology, each I/O pin can access, at most, one bit of data during an operation cycle. This substantially limits the potential bandwidth or speed of the memory device.

Modem applications call on electronic systems to process data at greater speeds. In order for the systems to accord these demands, the system components must increase their processing speeds. One method to increase the processing speeds is to provide additional I/O pins on the system components. However, space limitations on both microprocessor chips and memory chips preclude simply adding more and more I/O pins. Another method to increase processing speeds is to decrease the cycle time for retrieving and storing data. Upper limits for increasing cycle speeds are set by current feature size (F) of the discrete devices from which the integrated circuit is composed. Modem photolithographic techniques, however, limit the size of the circuits that can be formed from semiconductor and other materials. At some point, the lithography cannot create a fine enough image with sufficient clarity to decrease the size of the elements of the circuit any further.

For the reasons stated above, and for other reasons stated below which will become apparent to those skilled in the art upon reading and understanding the present specification, it is desirable to develop other methods to increase the data throughput or data bandwidth without requiring an increase in I/O pins or further decrease the cycle times.

SUMMARY OF THE INVENTION

The above mentioned problems with memory devices and other problems are addressed by the present invention and will be understood by reading and studying the following specification. A memory circuit and method of increasing the data bandwidth per cycle are described which do not require additional input/output pins or a decrease in access times.

In particular, an illustrative embodiment of the present invention includes a memory array. The memory array has multiple rows of wordlines and multiple columns of bitlines. The intersection of the multiple rows of wordlines and multiple columns of bitlines form multiple memory cells. There are a number of sense amplifiers coupled to the multiple columns of bitlines. A number of column decoders are coupled to the number of sense amps. Each column decoder can access a select number of bitlines simultaneously. There are a number of row decoders coupled to the multiple rows of wordlines. A number of input/output lines are coupled to the bitlines through the number of sense amplifiers. Also, a number of logic circuits are included which couple to a subset of the input/output lines. The logic circuits use multiple voltage levels or references to control the reading and writing to more than one memory cell simultaneously. The reading and writing operations pass multiple bits through a single input/output pin with each operation cycle.

In another embodiment, a memory circuit is provided which similarly has a memory array. The memory array has multiple rows of wordlines and multiple columns of bitlines. At the intersections of the multiple rows of wordlines and multiple columns of bitlines are located multiple memory cells. A number of sense amplifiers are coupled to the multiple columns of bitlines. A number of column decoders couple to the number of sense amps such that a column decoder selects the output of at least two (2) sense amps. A number of row decoders couple to the multiple rows of wordlines. There are a number of input/output lines coupled to the bitlines through the number of sense amplifiers. There are a number of logic circuits which have multiple inputs and outputs. Each of the logic circuits is coupled to a subset of the input/output lines. The outputs of at least one of the number of logic circuits individually couples to a number of pull-up or pull-down transistors. The inputs of at least one of the number of logic circuits individually couples to a number of comparators. Each of the number of logic circuits uses multiple voltage levels to write to or read from more than one memory cell at a time.

In another embodiment, a method for writing to multiple memory cells using a single input pin is provided. The method includes receiving a voltage at the pin that represents values to be stored in several memory cells. The voltage at the pin is compared with a number of distinct voltage references using a number of comparators. The output of the comparing step is coupled to a logic circuit. The method includes the logic circuit outputting bits of data to a select number of input/output lines. A row in an array of memory cells is activated. The array has multiple rows of wordlines and multiple columns of bitlines. A select number of columns in the array of memory cells are activated simultaneously by a column decoder. The method further includes placing the bits of data located on the select number of input/output lines into memory cells located at the intersection of the activated row and select number of activated columns. The select number of input/output lines equals the select number of columns accessed simultaneously by one column decoder.

In another embodiment, a method for reading multiple memory cells using a single output pin is provided. The method includes activating a row in an array of memory cells. The array has multiple rows of wordlines and multiple columns of bitlines. The method also includes activating a select number of columns in the array of memory cells. The select number of columns are simultaneously accessed by a single column decoder. Bits of data located at the intersection of the activated row and select number of columns are placed onto a select number of input/output lines. The select number of input/output lines are then coupled to a logic circuit. The logic circuit has a number of outputs and each output is individually coupled to a pull-up or a pull-down transistor. The method further includes coupling the pull-up and pull-down transistors to a single output pin.

In another embodiment, an information handling system is provided. The information handling system includes a central processing unit and a random access memory (RAM). The RAM has a number of input/output pins. The RAM has multiple rows of wordlines and multiple columns of bitlines. The RAM has a number of sense amplifiers coupled to the multiple columns of bitlines. The RAM has a column decoder coupled to the multiple columns of bitlines that accesses a select number of bitlines simultaneously. The RAM has a row decoder coupled to the multiple rows of wordlines. There are a number of input/output lines coupled to the number of bitlines through sense amplifiers. A number of first logic circuits are each coupled to a select number of input/output lines. There are a number of pull-up transistors and a pull-down transistor coupled between an input/output pin and the first logic circuit for reading data out of the random access memory. A number of comparators are coupled to each input/output pin and each comparator is connected to a distinct voltage reference. A second logic circuit is coupled to the number of comparators for an input/output pin. The second logic circuit couples to a select number of input/output lines at any one time for writing data into the random access memory. A system bus communicatively couples to the central processing unit and the RAM.

This invention enables an electronic system with a memory circuit to have a greater data bandwidth or speed without increasing the number of input/output pins or decreasing the access time of the part. It is advantageous over increasing the input/output pin count because it uses much less die area for the bond pad area and possibly less area for signal routing. The implementation of the present invention will enable memory circuits to operate faster without having to resize the transistors, change the memory addressing sequence, change the operating voltage, or using other methods for increasing the overall speed of microprocessors. This method of compressing data can be applied to any device that would benefit from the ability to transfer more data through a limited number of I/O pins.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

FIG. 4A is a boolean logic circuit illustrating in more detail an embodiment of the I/O read logic portion of the I/O control circuit of FIG. 3.

FIG. 4B is a schematic diagram illustrating in more detail an embodiment of the pull-up/pull-down portion of the I/O control circuit of FIG. 3.

FIG. 4C is a truth table illustrating the inputs and outputs according to the embodiment of the logic circuit in FIG. 4A.

FIG. 5A is a schematic diagram illustrating in more detail an embodiment of the comparator circuit portion of the I/O control circuit of FIG. 3.

FIG. 5B is a boolean logic circuit illustrating in more detail an embodiment of the I/O write logic circuit portion of the I/O control circuit of FIG. 3.

FIG. 5C is a truth table illustrating the inputs and outputs according to the embodiment of the logic circuit in FIG. 5B.

DESCRIPTION OF THE EMBODIMENTS

Figure 1:
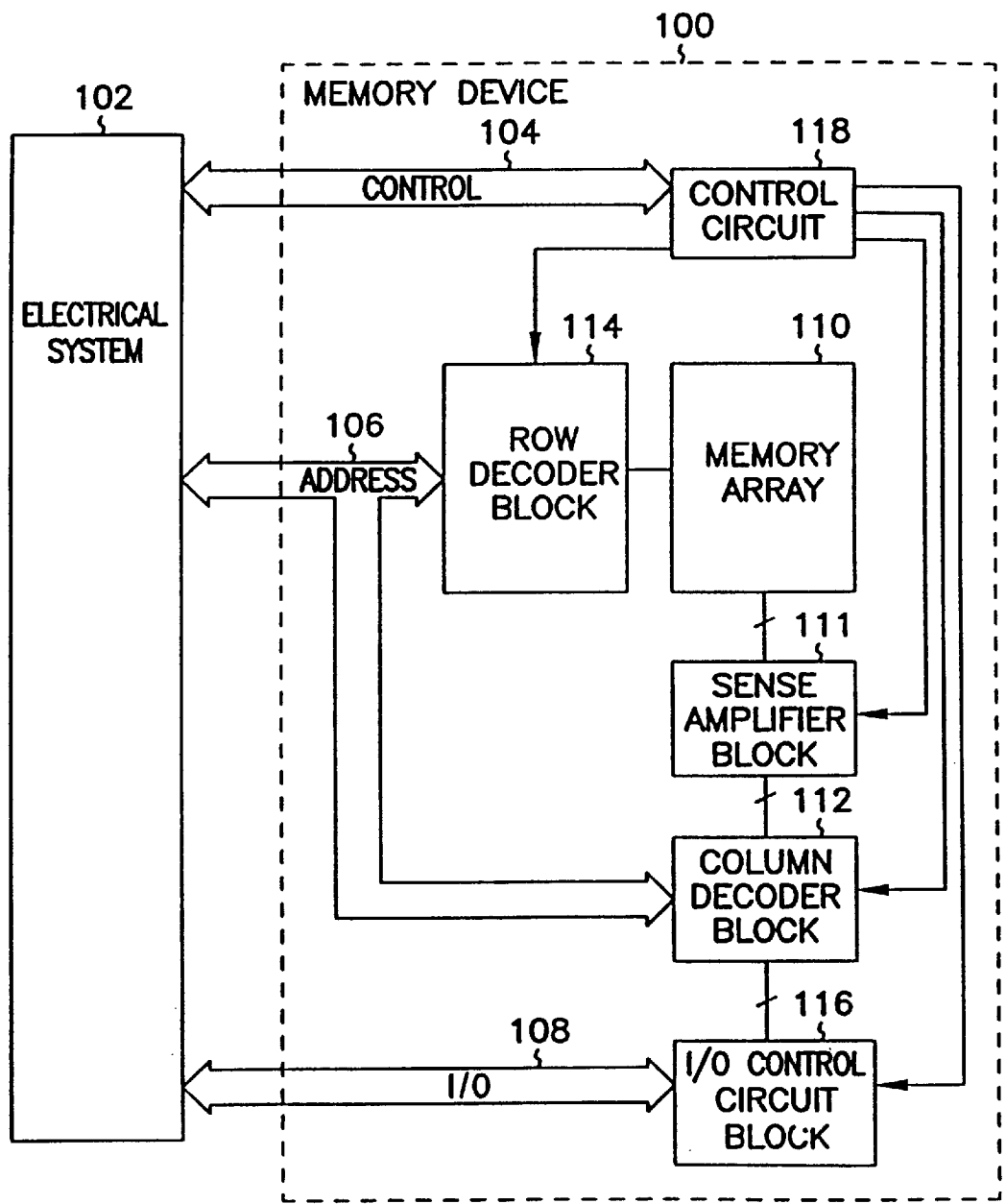
FIG. 1 is a block diagram illustrating an memory circuit according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

FIG. 1 is a block diagram illustrating an electronic circuit according to the teachings of the present invention.

FIG. 1 includes a memory array 110. The memory array 110 is coupled to a sense amplifier block 111. The sense amplifier block is coupled to a column decoder block 112. The memory array 110 is coupled to a row decoder block 114.

The column decoder block 112 is additionally coupled to an input/output (I/O) control circuit block 116.

FIG. 1 further includes an electronic system 102. The electronic system 102 couples through a control bus 104 to a control circuit 118. The control circuit 118 couples to the row decoder block 114, the sense amplifier block 111, the column decoder block 112 and the input/output control circuit block 116. The I/O control circuit block 116 additionally includes a grouping of a number of input/output pins 108 which couple to the electronic system 102. The electronic system 102 further includes an address bus 106 that couples to the row decoder block 114 and the column decoder block 112. The control circuit 118, the row decoder block 114, the memory array 110, the sense amplifier block 111, the column decoder block 112 and the I/O control circuit block 116 all form a part of memory device 100.

Figure 2:
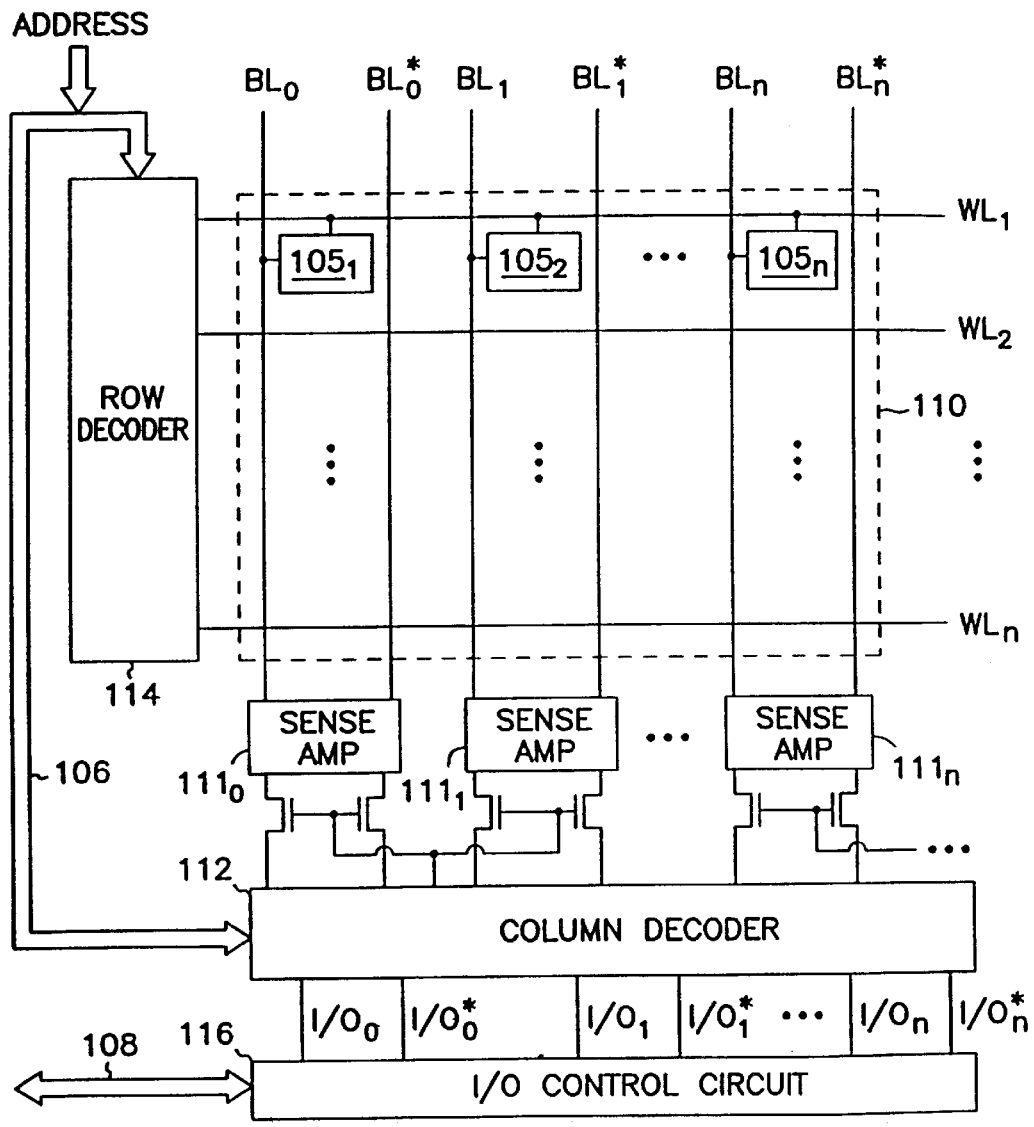
FIG. 2 is a block diagram illustrating in more detail the array of memory cells, the row and column decoders, and the input/output (I/O) control circuit of the memory circuit of FIG. 1

FIG. 2 is a block diagram illustrating in more detail a portion of the memory device 100. Memory array 110 includes multiple rows of wordlines, $WL_1, WL_2, \ldots, WL_n$, and multiple columns of bitlines, $BL_0, BL_1, \ldots, BL_n$. The intersection of the multiple rows of wordlines, $WL_1, WL_2, \ldots, WL_n$, and multiple columns of bitlines, $BL_0, BL_1, \ldots, BL_n$, form multiple memory cells $105_1$–$105_n$. The sense amplifier block 111 comprises a number of sense amplifiers, $111_0, 111_1, \ldots, 111_n$, which couple to the multiple columns of bitlines. The column decoder block 112 comprises a number of column decoders coupled to the number of sense amplifiers $111_0, 111_1, \ldots, 111_n$. Each column decoder accesses a select number of bitlines simultaneously. The row decoder block 114 includes a number of row decoders which couple to the multiple rows of wordlines. A number of input/output lines, $I/O_0, I/O_1, \ldots, I/O_n$, couple to the number of bitlines through the number of sense amplifiers. An address bus 106 couples to both the row decoder block 114 and the column decoder block 112. The number of input/output lines couple to the I/O control circuit block 116 and a number of I/O pins 108 couple to the I/O control circuit block.

Figure 3:
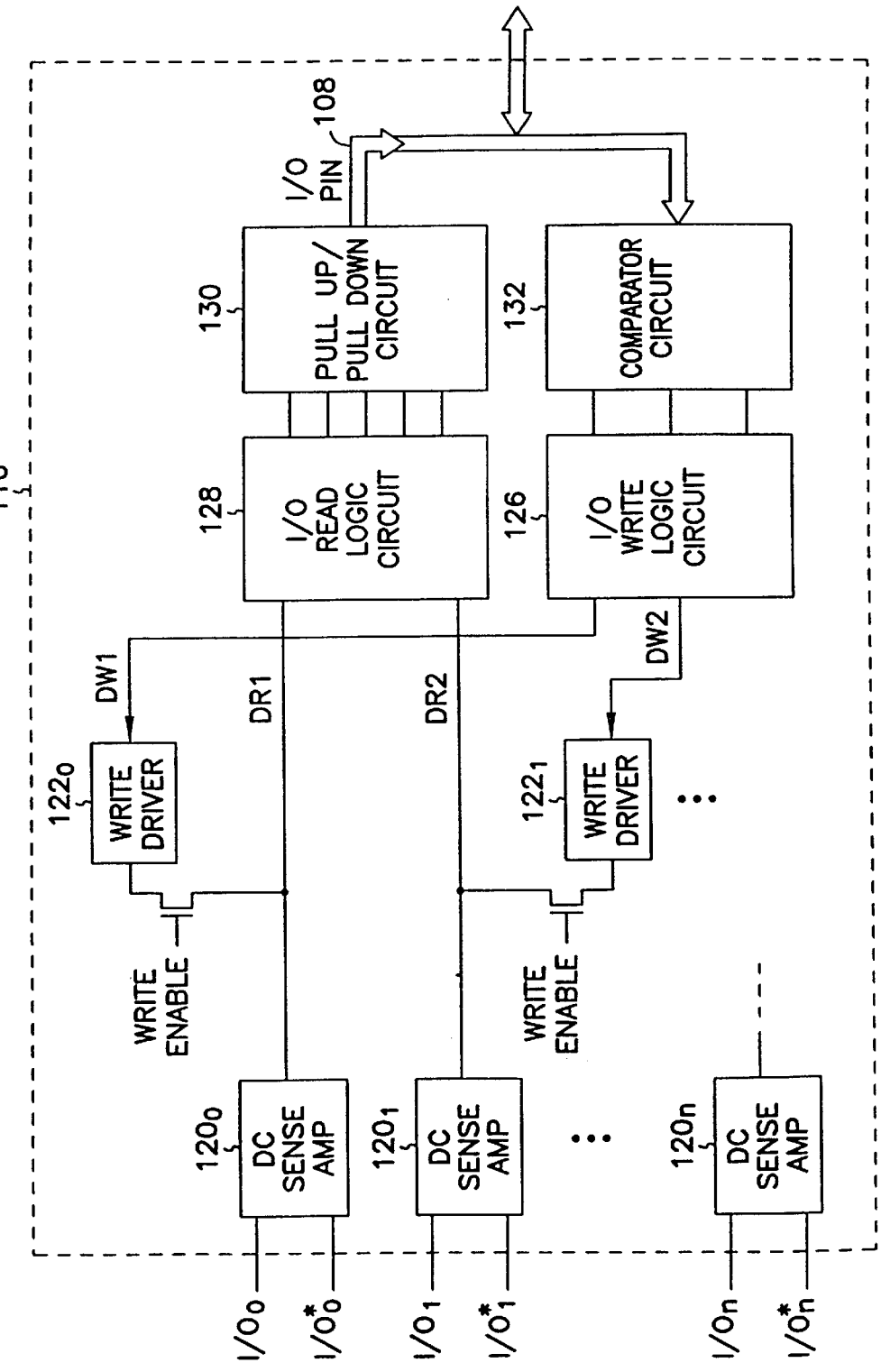
FIG. 3 is a block diagram illustrating in more detail the (I/O) control circuit portion of the memory circuit of FIG. 1.

FIG. 3 is a block diagram illustrating in more detail a portion of the I/O control circuit block 116 of the electronic circuit of FIG. 1. In FIG. 3, a number of input/output lines, $I/O_0, I/O_1, \ldots, I/O_n$, and their complementary pairs are coupled to a number of DC sense amplifiers, $120_0, 120_1, \ldots, 120_n$. The input/output lines, $I/O_0, I/O_1, \ldots I/O_n$, couple from the DC sense amplifier to a write enable pass transistor and into an input/output (I/O) read logic circuit 128. When the write enable pass transistor is deactivated, the number of input/output lines couple only to the I/O read logic circuit 128. The I/O read logic circuit 128 has multiple inputs and outputs. The outputs of the I/O read logic circuit 128 couple to a pull-up/pull-down circuit 130. The pull-up/pull-down circuit 130 couples to and delivers an analog output to a single input/output (I/O) pin 108. In any given "read" operation cycle, at least two pairs of complementary input/output lines have deactivated write enable pass transistors and directly input simultaneously into the I/O read logic circuit 128. In this embodiment, a single I/O pin 108 reads from at least two memory cells simultaneously. In an alternative embodiment, a single I/O pin reads from at least four memory cells simultaneously.

Conversely, when the write enable pass transistors are activated, the input/output lines, $I/O_0, I/O_1, \ldots, I/O_n$, couple through a write driver shown in FIG. 3 as $122_0$ and $122_1$. The write driver, $122_0$ and $122_1$ respectively, receives the output of an I/O write logic circuit 126. The I/O write logic circuit 126 receives a number of inputs from a comparator circuit 132. The comparator circuit 132 receives an input from a single I/O pin 108. In any given "write" operation cycle, at least two write enable pass transistors are activated simultaneously such that the output of the I/O write logic circuit 126 is coupled to at least two sets of input/output lines. This allows for a single I/O pin 108 to write to at least two memory cells simultaneously. In an alternative embodiment, a single I/O pin writes to at least four memory cells simultaneously.

FIG. 4A provides a Boolean logic circuit 140 which exemplifies in more detail an embodiment of the I/O read logic circuit 128 of the I/O control circuit block 116 of FIG. 3. In this embodiment, two input/output (I/O) lines, DR1 and DR2 respectively, couple to the I/O read logic circuit 128. The Boolean logic circuit 140 includes a NOR gate 142 outputting to a pull-down gate. The Boolean logic circuit 140 further includes a series of AND gates 144, 146 and 148 respectively. The output of AND gate 144 couples to a pull-up transistor. The output of AND gate 146 couples to a second pull-up transistor, and the output of AND gate 148 couples to a third pull-up transistor.

FIG. 4B provides a pull-up/pull-down circuit 150 which exemplifies, in more detail, an embodiment of the pull-up/pull-down circuit 130 of the I/O control circuit block 116. The pull-up/pull-down circuit 150 includes a number of pull-up and pull-down transistors. In the embodiment, a pull-up transistor 154 is coupled to a voltage level of $V_{dd}$. A pull-up transistor 156 is coupled to a voltage level of one-third ($\frac{1}{3}$) $V_{dd}$. A pull-up transistor 158 is coupled to a voltage level of two-thirds ($\frac{2}{3}$) $V_{dd}$. Further, a pull-down transistor 152 is coupled to ground. The pull-up and pull-down transistors, 152, 154, 156, and 158 respectively, are collectively coupled to a single input/output (I/O) pin. 159. In this embodiment, the number of pull-up and pull-down transistors output a single analog signal through a single I/O pin.

FIG. 4C is a truth table illustrating the inputs and outputs according to the embodiment of the Boolean logic circuit 140, illustrated in FIG. 4A. As illustrated, the four logical combinations for DR1 and DR2 each activate one of the transistors of pull-up/pull-down circuit 150. The selected transistor either pulls the I/O pin 159 up to its associated supply voltage, or down to ground. This analog voltage indicates the values stored in the multiple cells that are read simultaneously.

FIG. 5A provides a comparator circuit 160 which exemplifies, in more detail, an embodiment of the comparator circuit 132 of the I/O control circuit 116 of FIG. 3. In this embodiment, comparator circuit 160 receives an input through a single I/O pin 168. I/O pin 168 may be one in the same with I/O pin 159 above. The I/O pin 168 carries an analog signal. The I/O pin 168 couples to a number of comparators, 162, 164, 166 respectively. Each comparator, 162, 164, and 166 respectively, couples to a different voltage reference level. Comparator 166 couples to a voltage reference level of $V_{dd}$. Comparator 164 couples to a voltage level reference of two-thirds ($\frac{2}{3}$) $V_{dd}$. Comparator 162 couples to a voltage level reference of one-third ($\frac{1}{3}$) $V_{dd}$.

FIG. 5B provides a Boolean logic circuit 170 illustrating in more detail an embodiment of the I/O write logic circuit 126 of the I/O control circuit 116 of FIG. 3. In this embodiment, Boolean logic circuit 170 includes a pair of OR gates, 172 and 174 respectively. The Boolean logic circuit 170 receives multiple inputs from the embodiment of the comparator circuit 160. The Boolean logic circuit 170 outputs to I/O lines DW1 and DW2. The I/O lines, DW1 and DW2, carry digital signals. The output of the $V_{dd}$ comparator and the two-thirds ($\frac{2}{3}$) $V_{dd}$ comparator are input to OR gate 172 of the Boolean logic circuit 170. The output of the $V_{dd}$ comparator and the one-third ($\frac{1}{3}$) $V_{dd}$ comparator are input into OR gate 174.

FIG. 5C is a truth table illustrating the inputs and outputs according to the embodiment of Boolean logic circuit 170 illustrated in FIG. 5B. As illustrated, the four logical combinations for DW1 and DW2 each result from the output of a pair of comparators of comparator circuit 160. The output of the comparators route the analog signal received from the I/O pin 168 to the Boolean logic circuit 170. The Boolean logic circuit 170 translates the values represented by the analog signal into bits of digital data for storage in multiple cells simultaneously.

METHOD OF OPERATION

In operation, the method of writing to multiple memory cells, within memory array 110, includes receiving an analog voltage at a single input/output (I/O) pin 108. The voltage received at the pin 108 represents at least two (2) binary values to be stored in multiple memory cells. The voltage received at the I/O pin 108 is input to a comparator circuit 132. The comparator circuit 132 includes an exemplary embodiment, such as comparator circuit 160. The comparator circuit 160 includes a number of comparators, 162, 164, and 166 respectively. The voltage input, received at I/O pin 108, is compared with a number of distinct voltage references using comparators, 162, 164, and 166 respectively. The distinct voltage references include $V_{dd}$, two-thirds (⅔) $V_{dd}$, and one-third (⅓) $V_{dd}$. The output of comparator circuit 160 is coupled to an I/O write logic circuit 126. The I/O write logic circuit 126 includes an embodiment of Boolean logic circuit 170. Boolean logic circuit 170 outputs to a select number of input/output lines. The select number of I/O lines, equals at least two, DW1 and DW2 respectively. A row (wordline) within the memory array 110 is activated. A select number of columns within the memory array 110 are activated by the column decoder 112, e.g., two columns. The bits of data located on the select number of input/output lines, DW1 and DW2 respectively, are placed into individual memory cells, within the array 110, which are located at the intersection of the activated row and select number of activated columns. In one embodiment, the select number of input/output lines, DW1 and DW2 respectively, equals the select number of columns accessed simultaneously by the column decoder 112.

In the read operation, the method includes activating a row (wordline) in a memory array 110. Column decoder 112 activates a select number of columns of bitlines in the memory array 110. Bits of digital data, located at the intersection of the activated row and select number of columns, are placed onto a select number of input/output lines. In one embodiment, the bits of data are placed on at least two (2) I/O lines, DR1 and DR2 respectively. The select number of I/O lines are coupled to an I/O read logic circuit 128 wherein the I/O read logic circuit 128 has a number of outputs. The number of I/O lines coupling to an embodiment of the I/O read logic circuit 128 carry bits of digital data into the I/O read logic circuit 128. Each output of the I/O read logic circuit 128 is coupled to a pull-up/pull-down circuit 130. The I/O read logic circuit 128 includes the embodiment of Boolean logic circuit 140. The Boolean logic circuit 140 includes NOR gate 142, AND gate 144, AND gate 146, and AND gate 148. Each of the gates, 142, 144, 146, and 148 respectively, have outputs such that each output is individually coupled to a pull-up or pull-down transistor within pull-up/pull-down circuit 130. The pull-up/pull-down circuit 130 includes a pull-down transistor 152, a pull-up transistor 154, a pull-up transistor 156, and a pull-up transistor 158. The number of pull-up and pull-down transistors in pull-up/pull-down circuit 130 couple to multiple voltage levels. The number of pull-up and pull-down transistors in pull-up/pull-down circuit 130 couple an analog signal to a single input/output pin 159.

Figure 6:
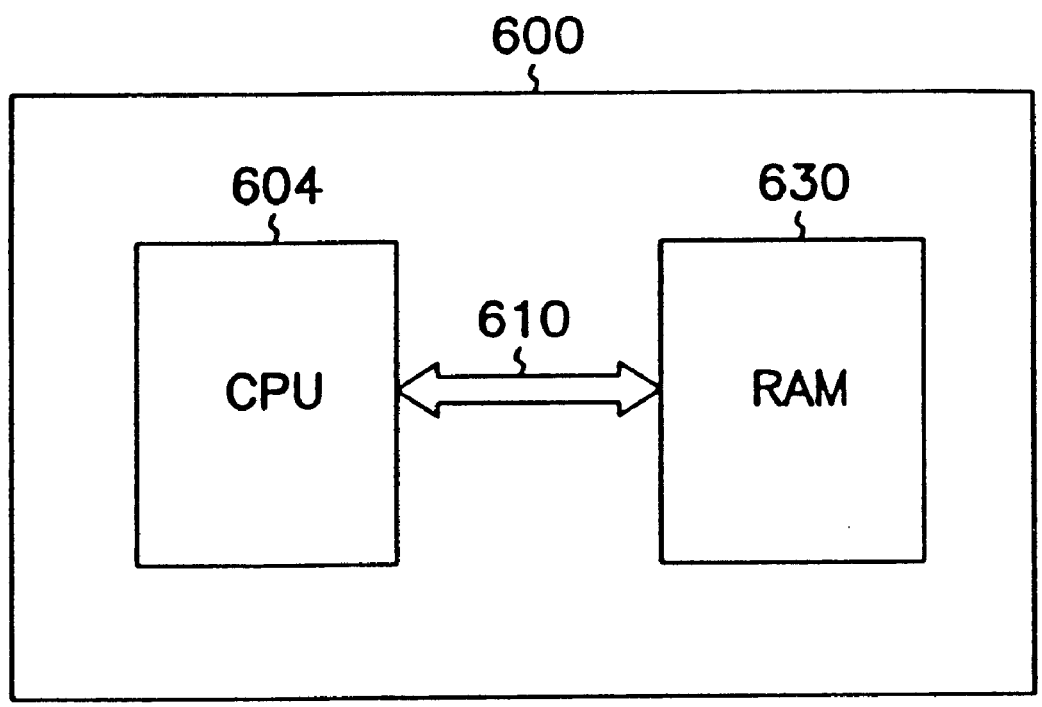
FIG. 6 is a block diagram illustrating an information handling system according to an embodiment of the present invention.

FIG. 6 is a block diagram illustrating an information handling system 600 according to an embodiment of the present invention. The information handling system includes a central processing unit 604. The central processing unit is coupled to a random access memory (RAM) 630 by a system bus 610. The RAM can be constructed as the memory device 100 shown in the previous Figures.

CONCLUSION

It is to be understood that the above description is intended to be illustrative, and not restrictive. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. The scope of the invention should be determined with reference to the appended claims along with the full scope of equivalents to which such claims are entitled.

What is claimed is:

1. A method for outputting bits of data from multiple input/output lines using a single output pin, comprising:
    coupling a number of input/output lines to a logic circuit, wherein the logic circuit has a number of outputs, each output is individually coupled to a pull-up or pull-down transistor; and
    coupling the pull-up and pull down transistors to the single output pin.

2. The method of claim 1, wherein coupling the pull-up and pull-down transistors to the output pin places an analog signal on the output pin.

3. The method of claim 1, wherein coupling the input/output lines to the logic circuit comprises coupling bits of data into the logic circuit.

4. The method of claim 1, wherein coupling a number of input/output lines to a logic circuit includes coupling at least four (4) input/output lines to the logic circuit.

5. The method of claim 1, including deactivating write enable pass transistors coupled to the input/output lines.

6. A method for outputting bits of data from a memory array through a single input/output pin, comprising:
    activating a row of wordlines and a select number of columns of bitlines to access the bits of data stored in the memory array;
    placing the bits of data onto a select number of input/output lines;
    passing the bits of data through a logic circuit and outputting a plurality of signals on separate outputs; and
    processing the plurality of signals with a pull-up/pull-down circuit to provide an analog signal representative of the bits of data to the input/output pin.

7. The method of claim 6, including coupling complementary input/output lines to write enable pass transistors, and deactivating the write enable pass transistors via the complementary input/output lines.

8. The method of claim 7, including coupling pairs of the input/output lines and pairs of the complementary input/output lines to corresponding DC sense amplifiers.

9. The method of claim 8, wherein the pull-up/pull-down circuit includes a plurality of transistors coupled to the single input/output pin and provided with distinct reference voltages.

10. The method of claim 8, including accessing at least two bits of data simultaneously from the memory array.

11. A method for outputting bits of data stored in an array of memory cells through a single input/output pin, comprising:
  simultaneously accessing at least two bits of data from the array of memory cells;
  placing the at least two bits of data on corresponding at least two input/output lines;
  inputting the at least two bits of data to a logic circuit and generating a plurality of outputs;
  processing the plurality of logic circuit outputs with a pull-up/pull-down circuit;
  forming with the pull-up/pull down circuit an analog signal representing the at least two bits of data; and
  outputting the analog signal to the single input/output pin.

12. The method of claim 11, wherein the logic circuit includes a number of gates, and the pull-up/pull down circuit includes a corresponding number of transistors, and including coupling each gate to a transistor.

13. The method of claim 12, including employing a column decoder and a row decoder to access the at least two bits of data by activating at least two columns in the column decoder.

14. The method of claim 13, including controlling storing data in the array of memory cells via a central processing unit (CPU) coupled to the array of memory cells.

15. The method of claim 11, including:
  connecting each of the at least two input/output lines to a respective write enable pass transistor that controls inputting and outputting data to and from the array of memory cells; and
  deactivating the write enable pass transistors to enable outputting of the at least two bits of data.

16. A method for outputting through a single pin, data stored in a memory array, comprising:
  simultaneously accessing a plurality of bits stored in the memory array;
  transmitting the plurality of bits as a plurality of digital electrical signals on a corresponding plurality of input/output lines;
  logically processing the plurality of digital electrical signals with a number of logic gates each having an output;
  coupling each logic gate output to a pull-up/pull down circuit coupled to the single pin; and
  creating an analog signal representative of the plurality of bits and providing the analog signal to the single pin.

17. The method of claim 16, including forming the pull-up/pull-down circuit from a plurality of transistors each provided with a different reference voltage and arranged to combine multiple digital signals from the logic circuit to form the analog signal.

18. The method of claim 16, wherein at least two complementary input/output lines are connected to respective write enable pass transistors, and including deactivating the write enable pass transistors to allow for the simultaneous accessing of the plurality of bits stored in the memory array.

19. The method of claim 16, wherein the memory array includes memory cells defined by bit lines and word lines, and wherein simultaneous accessing of the plurality of bits from the memory array includes activating a plurality of bits lines using a column decoder block and a word line using a row decoder block.

20. The method of claim 19, including controlling the simultaneous accessing of the plurality of bits by a central processing unit (CPU) connected to the column decoder block and row decoder block.

21. A method for outputting data from multiple memory cells using a single output pin, comprising:
  activating two or more select bitlines and a select wordline to access two or more bits of data from the memory cells;
  placing the two or more bits of data onto a select number of input/output lines coupled to a logic circuit, wherein the logic circuit has a number of outputs, with each output individually coupled to one of a pull-up and pull-down transistor; and
  coupling the pull-up and pull-down transistors to the single output pin.

22. The method of claim 21, wherein coupling the pull-up and pull-down transistors to the single output pin places an analog signal representative of the two or more bits of data on the single output pin.

23. The method of claim 21, including deactivating write enable pass transistors connected to the select number of input/output lines.

24. The method of claim 21, including activating the two or more select bitlines using a column decoder controlled by a central processing unit (CPU).

25. A method for outputting data from a single output pin of a device, comprising:
  providing a number of electronic signals onto a corresponding number of input/output lines to a logic circuit, with each electronic signal representing a bit of data;
  logically processing the electronic signals with the logic circuit to form individual outputs;
  combining the logic circuit outputs using a pull-up/pull down circuit to form an analog signal representative of the bits of data in the electronic signals; and
  providing the analog signal to the single output pin.

26. The method of claim 25, including accessing memory cells in a memory array to provide the electronic signals.

27. The method of claim 25, including simultaneously accessing a select number of bitlines and a single wordline.

28. A method for outputting data from a memory array through a single pin, comprising:
  simultaneously accessing a number of memory cells in the memory array via activating a number of bitlines and a single wordline;
  providing the accessed data to a number of input/outline lines connected to DC sense amplifiers, a write enable pass transistor and a logic circuit;
  deactivating the write enable pass transistor to allow the accessed data to be transmitted to the logic circuit;
  processing the accessed data with the logic circuit to provide individual outputs to individual pull-up or pull-down transistors in a pull-up/pull down circuit;
  forming in the pull-up/pull down circuit an analog signal representative of the accessed data; and
  providing the analog signal to the single pin.

29. The method of claim 28, including connecting a central processing unit (CPU) to the memory array and controlling the accessing of the number of memory cells via the central processing unit (CPU).

30. The method of claim 28, including providing distinct reference voltages to each of the pull-up or pull-down transistors.

* * * * *

UNITED STATES PATENT AND TRADEMARK OFFICE
CERTIFICATE OF CORRECTION

PATENT NO. : 6,515,915 B2  
DATED : February 4, 2003  
INVENTOR(S) : Scott J. Derner It is certified that error appears in the above-identified patent and that said Letters Patent is hereby corrected as shown below:

Title page,
Item [56], U.S. PATENT DOCUMENTS, delete "Muramaki" and insert -- Murakami -- therefor.

Column 1,
Line 34, delete "," after "data".
Lines 41 and 52, delete "Modem" and insert -- Modern -- therefor.

Column 3,
Line 62, delete "an" after "illustrating" and insert -- a -- therefor.
Line 67, insert -- . -- after "FIG. 1".

Column 6,
Line 27, delete "." after "pin".

Column 8,
Line 28, delete "pull down" and insert -- pull-down -- therefor.
Line 66, delete "claim 8" and insert -- claim 6 -- therefor.

Column 9,
Lines 13, 17 and 45, delete "pull down" and insert -- pull-down -- therefor.

Column 10,
Lines 33-34, 54 and 55, delete "pull down" and insert -- pull-down -- therefor.

Signed and Sealed this

Twelfth Day of August, 2003

JAMES E. ROGAN
*Director of the United States Patent and Trademark Office*